United States Patent [19]
Glider et al.

[11] Patent Number: 5,226,010
[45] Date of Patent: Jul. 6, 1993

[54] METHOD AND APPARATUS FOR SIMULTANEOUS, INTERLEAVED ACCESS OF MULTIPLE MEMORIES BY MULTIPLE PORTS

[75] Inventors: Joseph S. Glider, Palo Alto; Kaushik S. Shah, Santa Clara; Edward E. Asato, Sunnyvale, all of Calif.

[73] Assignee: Micro Technology, Inc., Sunnyvale, Calif.

[21] Appl. No.: 964,793

[22] Filed: Oct. 22, 1992

Related U.S. Application Data

[63] Continuation of Ser. No. 505,297, Apr. 5, 1990, Pat. No. 5,202,856.

[51] Int. Cl.$^5$ .............................................. G11C 13/00
[52] U.S. Cl. ........................ 365/189.04; 365/230.01
[58] Field of Search ...................... 365/189.01, 189.04, 365/189.05, 230.01, 230.08, 230.02

[56] References Cited

U.S. PATENT DOCUMENTS

5,097,118  3/1992  Iijima .............................. 365/230.01

*Primary Examiner*—Terrell W. Fears
*Attorney, Agent, or Firm*—Townsend and Townsend Khourie and Crew

[57] ABSTRACT

A memory system having multiple memories and multiple ports. Multiplexing logic couples each of the ports to each of the memories. A sequencing circuit controls the multiplexers so that each port is sequentially coupled to each of the memories in sequence in a repeating cycle. When coupled to each memory, a block of data is transferred. A second port is coupled to a different memory at each point in time, with the two ports being switched simultaneously to avoid overlap. A port desiring access to the system must wait until it can fit into this switching queue so that it can transfer in lock-step with the other ports to a different memory. Each port has a data I/O bus, an address input bus, an address counter and R/W controls.

9 Claims, 8 Drawing Sheets

METHOD AND APPARATUS FOR SIMULTANEOUS, INTERLEAVED ACCESS OF MULTIPLE MEMORIES BY MULTIPLE PORTS

This application is a continuation of Ser. No. 07/505,297 filed Apr. 5, 1990, now U.S. Pat. No. 5,202,856.

BACKGROUND

The present invention relates to methods and apparatus for providing multiple external devices with access to a single memory system.

Data processing systems with multiple asynchronous processors often include global data memory to allow data to be shared in various ways among those processors.

Storage control and management systems also may include multiple asynchronous processors and a global data memory. In this scenario, the various processors have different functions: one may be responsible for movement of data between an external computer system and the storage control system, and another may be responsible for movement of the data on and off of a disc. However, there is still the need for multiple processors to be able to read and write the data in a common memory, while it is in transit between the host and disc.

Such a common memory necessarily requires arbitration between potential users for access to the memory. One typical example might be a system built around a VME bus backplane, where all potential users have access to a common VME bus, and having arbitrated for the bus, the user has, by extension, arbitrated for use of the common memory. In such systems, a first weakness is that only one user may access the memory at a time, and other users must wait for some period of time corresponding to the number of potential users of the bus and the maximum time that one user may be on the bus.

Another weakness of this system, for the case of a storage control system, is that each element of data in transit between host and disc must transfer over the system bus twice: once to be written into the memory by the external computer, and once to be read out again by the controller for the storage control system. This effectively halves the bandwidth of the system.

It would be desirable to provide a memory in which multiple users can access various portions of the memory simultaneously. It would also be desirable to provide a memory subsystem where data did not have to travel over the same bus multiple times.

SUMMARY OF THE INVENTION

The present invention is a method and apparatus for arranging a memory so that multiple users can access the memory at the same time without interfering with each other. The present invention provides a memory system having multiple memories and multiple ports. Each port contains the circuitry for interfacing between a bus and the memory system. Multiplexing logic couples each of the ports to each of the memories. A sequencing circuit controls the multiplexers so that each port is sequentially coupled to each of the memories in sequence in a repeating cycle. When coupled to each memory, a block of data is transferred. A second port is coupled to a different memory at each point in time, with the two ports being switched simultaneously to avoid overlap. A port desiring access to the system must wait until it can fit into this switching queue so that it can transfer in lock-step with the other ports to a different memory. Each port has a data input/output (I/O) bus, an address input bus, a data length counter, an address counter and read/write (R/W) controls.

In one embodiment, four different memories are provided with three ports. For example, first port may initially be writing data to the first memory. Before a block is written, a second port may request to write data to the same first memory. The second port will have to wait until the first port switches to the second memory, at which time the second port can start writing to the first memory. After a block is written by each port, the first part switches to the third memory while the second port switches to the second memory. During this time, a third part may request to read starting from the second memory. It will have to wait until the second port is done with the second memory, and can start reading from the second memory when the first port shifts to the fourth memory and the second port shifts to the third memory. Thereafter, the cycle can continue with the subsequent block being written by the first port to the first memory, the second port writing to the fourth memory, and the third port switching to the third memory to read the next block of the section of data it is interested in.

The present invention thus provides a system which allows each port to use nearly its full bandwidth for a data transfer. Because any write is interleaved in this process among the multiple memories, a subsequent read of the same data must also be interleaved, and can be timed to fall in lock step behind any other ports already accessing the memories. Thus all three ports can be running simultaneously.

Associated with each port is an address register. This address register, when loaded by the user, specifies the memory location(s) that the user wishes to read or write from. Also associated with each port is a length register, specifying how many memory locations the user wishes to access, and a control register, specifying whether the user wishes to read or write, whether the user wishes the address register to be incremented after each access to the memory, and a 'Transfer Enable' bit to specify that the user wishes the memory access to begin.

The memory system also contains crossbar switch control logic. This control logic determines, by the state of the 'Transfer Enable' bit associated with each port, which external buses are enabled to transfer data. The crossbar switch logic also arranges for one and only one bus to be connected to a memory bank, and holds off all other buses from accessing that memory bank. The crossbar logic may allow all buses to be connected and transferring to or from memory banks, as long as each bus is connected to a different memory bank.

For a fuller understanding of the nature and advantages of the invention, reference should be made to the ensuing detailed description taken in conjunction with the accompanying drawings.

BRIEF DESCRIPTION OF THE DRAWINGS

FIG. 5 including FIGS. 5A and 5B is a diagram of the memory and multiplexing module of FIG. 3.

DETAILED DESCRIPTION OF THE PREFERRED EMBODIMENT

Figure 1A:
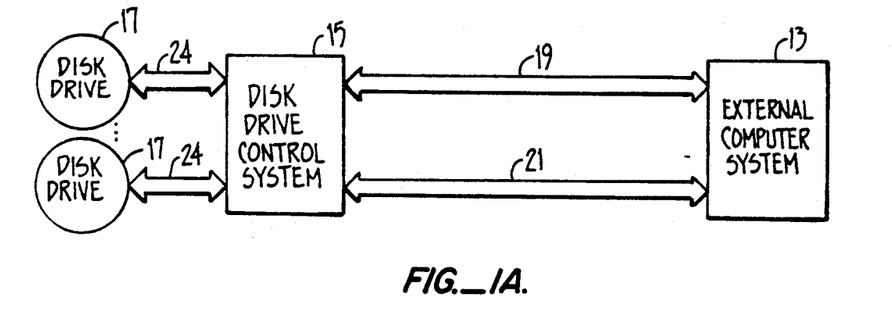
FIG. 1A is a block diagram of a system containing the present invention.

FIG. 1A shows a computer system with an external computer 13 and a disk drive control system 15. Disk drives 17 are coupled to disk drive control system 15. The memory system of the present invention is a staging memory which is connected in the manner of a buffer in disk drive control system 15. System 15 is shown in more detail in FIG. 3, with the staging memory being in disk interfaces 30, which are shown in more detail in FIGS. 4 and 5.

In one prior art system, for example a system built around a VME backplane, a global memory, external computer and disk drive control system are connected by a single bus so that, for a data transfer to the disk drives, the external computer must write into the memory using the common bus before the disk drive control system can later read using the same bus.

In the present invention, external computer system 13 can access the staging memory in disk drive control system 15 over bus 19 or 21 (through external computer interface 31 in FIG. 3) while, at the same time, the disk drives can access the staging memory over buses 24. The memory thus acts as a large buffer.

Figure 1B:
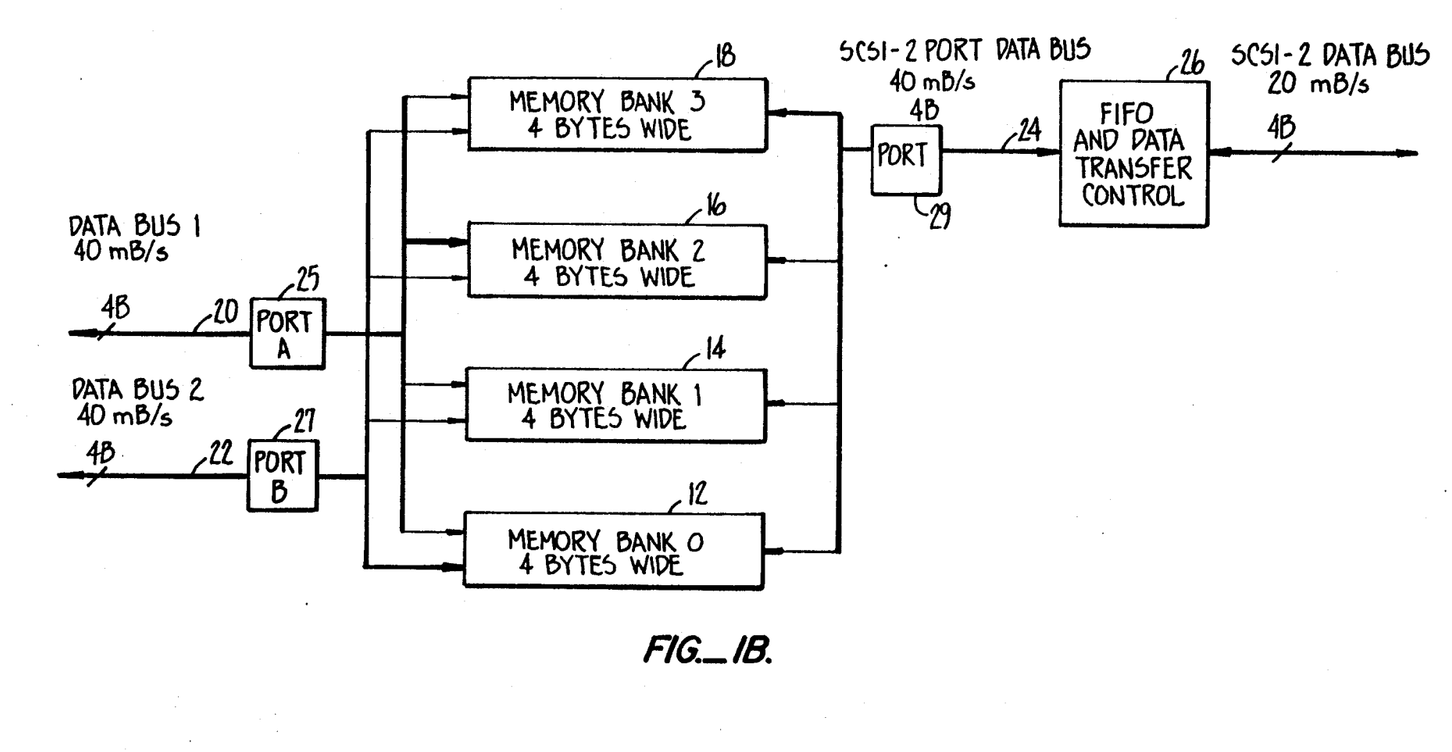
FIG. 1B is a block diagram of a memory subsystem according to the present invention with four memory banks.

FIG. 1B shows a block diagram of one embodiment of the memory system within disk drive control system 15 of FIG. 1A. Four memory banks 12, 14, 16 and 18 are provided. Two data buses 20 and 22 are shown on the left-hand side, coupled to ports 25 and 27, respectively, with a third data bus 24 on the right-hand side coupled to a port 29. The right-hand data bus 24 is also coupled through a FIFO circuit 26. Each port can be coupled to any of the memory banks so that all three ports can be accessing different memory banks at one time. In one example, as shown by the dark, solid lines, port 25 is accessing memory bank 16 while port 27 accesses memory bank 12 and port 29 accesses memory bank 18. The dotted lines show the other possible access paths.

Data is written into or read from the memory banks in sequential fashion, such that the data written is distributed between the four banks, and it is read the same way. Thus, upon any access to memory, the ports can rotate among the different memory banks without interfering with each other. For example, in FIG. 1B, after the access is completed for the section in the memory banks to which the buses are shown connected, bus 22 could shift up to memory bank 18, bus 24 shift down to memory bank 16, and bus 20 shift down to memory bank 14. By constraining the system to distribute data among the memory banks, any port can enter the rotation for a read or write at any time and fall into lock step behind the other bus or buses since its data will necessarily be spread over the four memories in order, and it can thus access from each of the memories in order.

Figure 2A:
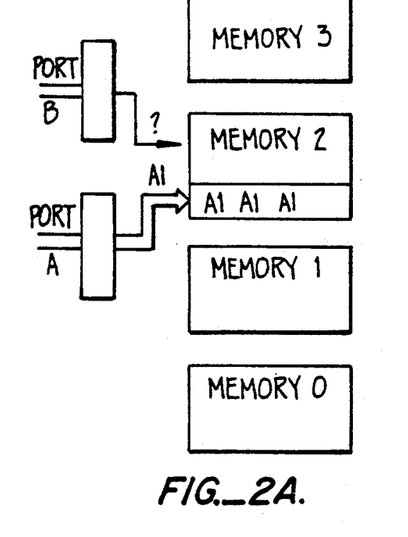
FIGS. 2A–2F are diagrams illustrating the lock-step process of accessing the memory of FIG. 1.
Figure 2B:
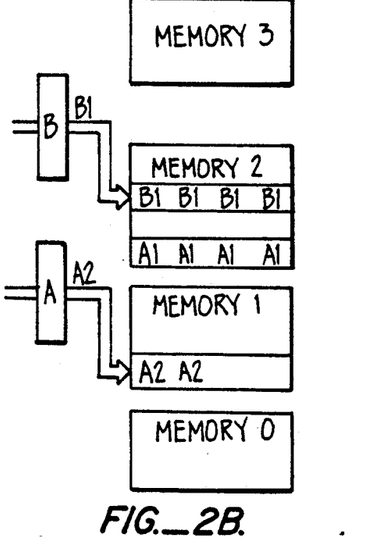

This is illustrated in more detail in FIGS. 2A-2F. In FIG. 2A, a port A is shown writing data A1 into a memory 2. At the same time, a port B requests memory 2 (as indicated by the question mark) but is held off until port A finishes with memory 2. As shown on FIG. 2B, port A is connected to memory 1 to write the second portion of its data, A2. At this time, port B is given access to memory 2 to start writing the first portion of its data B1.

Figure 2C:
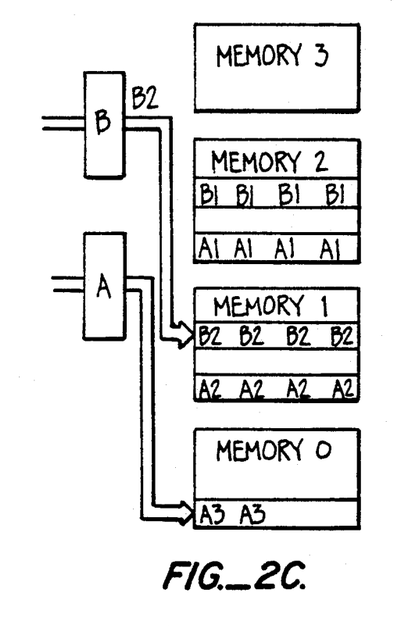

Continuing on to FIG. 2C, after the B1 and A2 sections are written, port A shifts to memory 0 to write in portion A3, while port B2 shifts to memory 1 to write in portion B2.

Figure 2D:
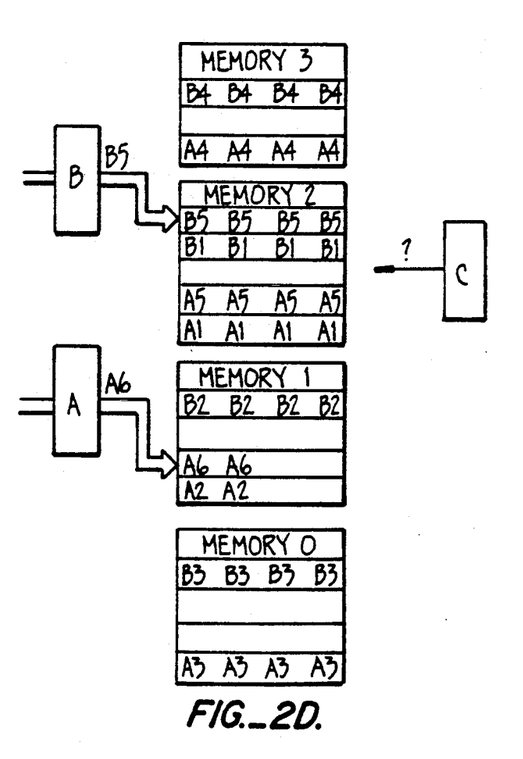

FIG. 2D shows several memory shifts later, at which time port B is writing section B5 into memory 2 while port A is writing memory section A6 into memory 1. At this time, port C requests to start reading the A1 data from memory 2. Port C must wait until port B is finished with memory 2 to start reading.

Figures 2E, 2F:
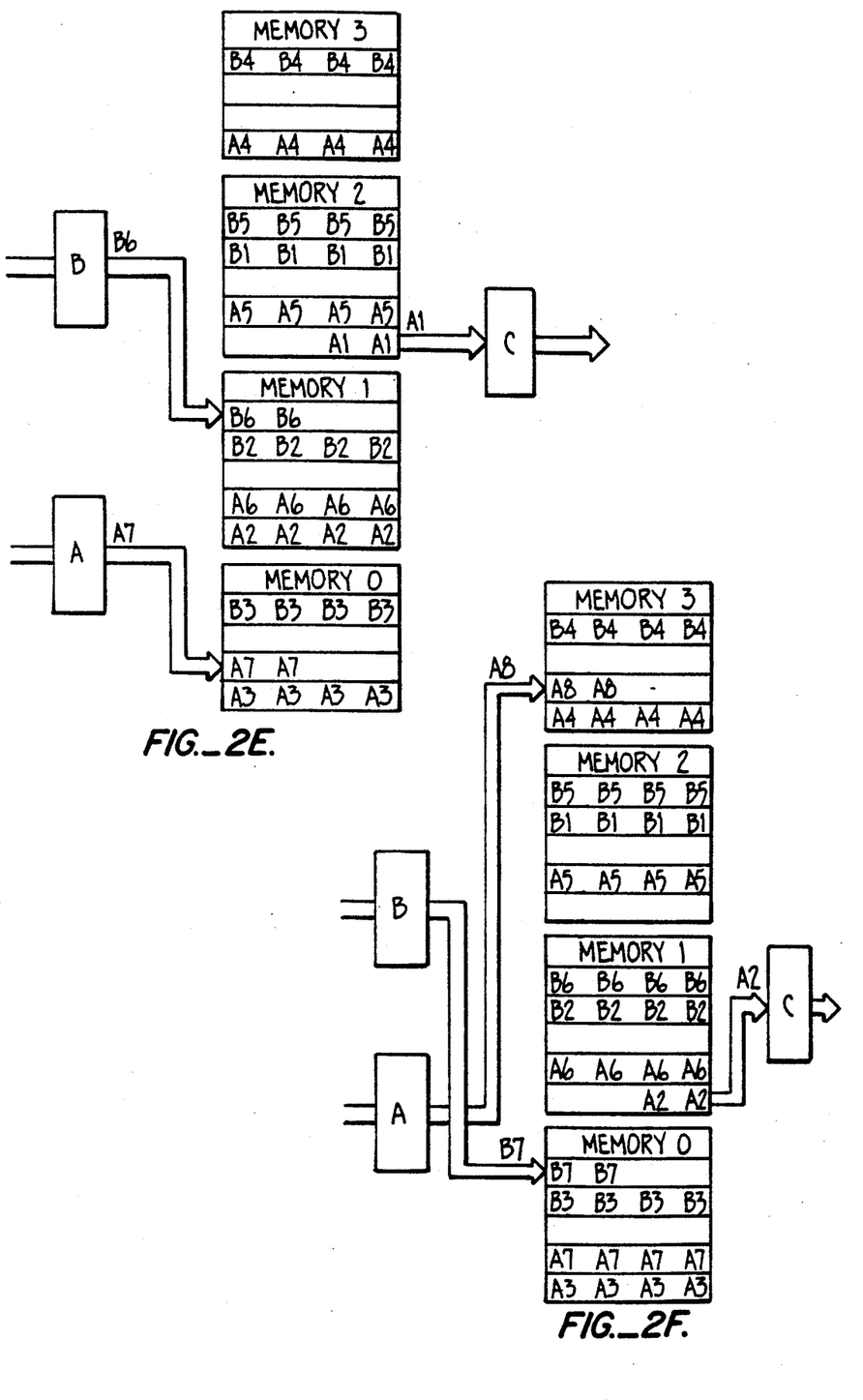

As shown in FIG. 2E, when port B switches to memory 1, memory 2 is freed up, and port C starts reading data A1 from memory 2. As shown in FIG. 2F, when port B shifts down to memory 0, with port A shifting up to memory 3, memory 1 will then be available, allowing port C to shift down and read the second section of the A data, A2, from memory 1. As can be seen, this sequence can be continued with all three ports having access to a memory at nearly their full bandwidth without interfering with each other.

Figure 3:
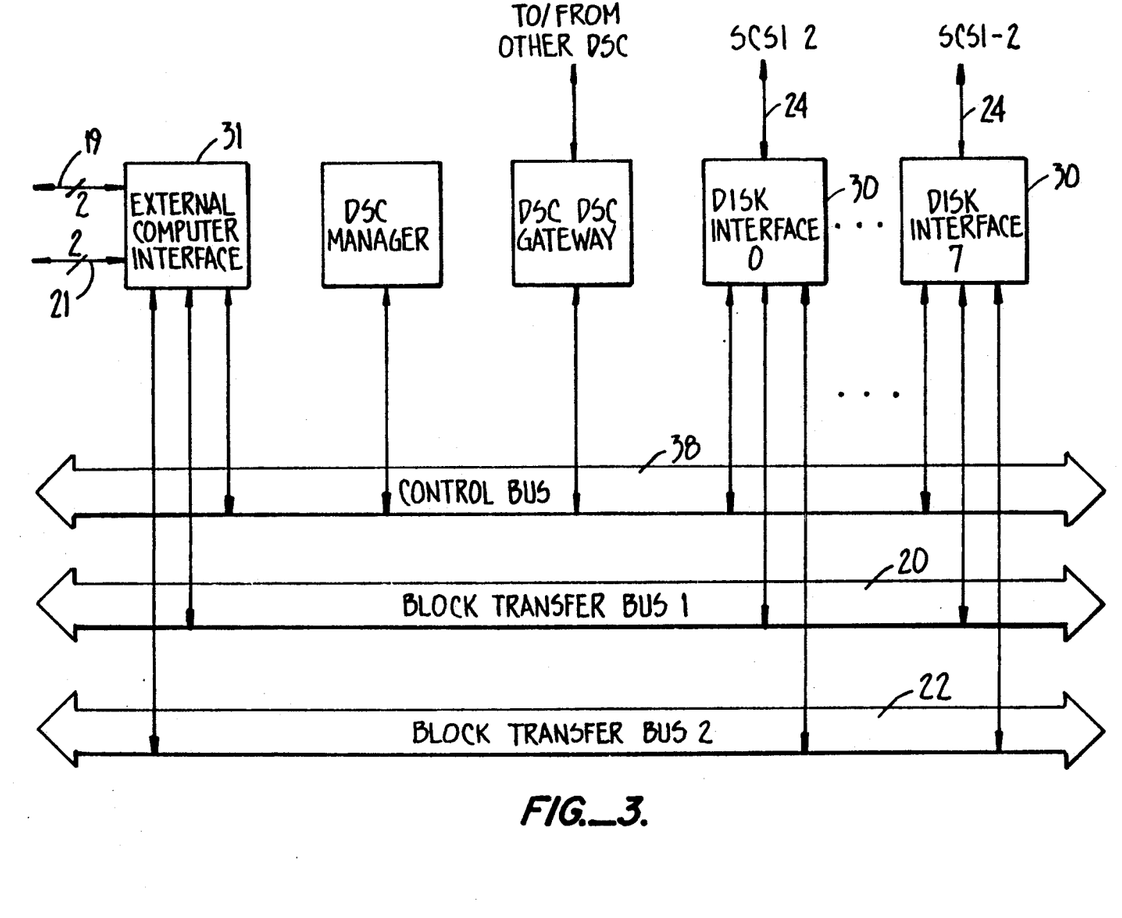
FIG. 3 is a block diagram of a typical environment in which the present invention may be used.

FIG. 3 shows an example of a system in which the present invention can be incorporated. The invention is found in each of up to eight disk interfaces (0-7) 30. Each disk interface 30 is coupled to data buses 20 and 22 as shown. These buses can then couple to disc drives or other devices which will maintain copies of the data and are not shown. On the other side, each disk interface 30 is shown coupled to a SCSI-2 bus 24. As can be seen, if two different disk interfaces 30 are each using one of block transfer buses 20, 22, then neither can have all three ports active at once. FIG. 3 also shows a control bus 38 along with other logic unrelated to the present invention. Suitably programmed microprocessors contained in each of disk interfaces 30 and external computer interface 31 are coupled to control bus 38 and can provide the control signals necessary for the sequencing of data into and out of the memory banks of the present invention.

Figure 4:
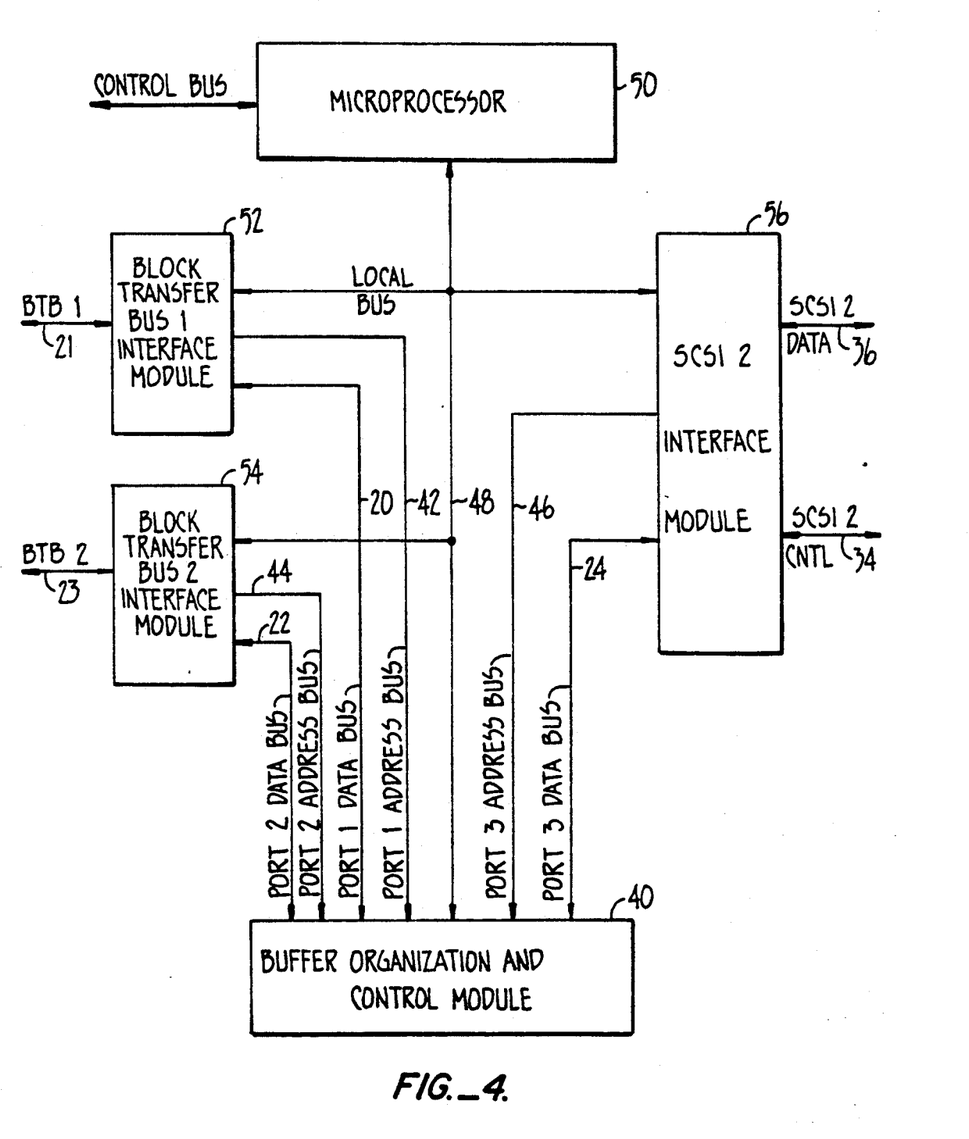
FIG. 4 is a block diagram showing the interface and control modules for the system of FIG. 1.

FIG. 4 is a block diagram of one of the disk interfaces 30 of FIG. 3. A buffer organization and control module 40 contains the four memory banks shown in FIG. 1B. In addition to the data buses 20, 22 and 24, corresponding address buses 42, 44 and 46 are shown. In addition, a local bus 48 is shown which provides the microprocessor with the ability to read or write from the memory.

Local bus 48 is coupled to a microprocessor 50 which controls the system. Two block transfer interface modules 52 and 54 couple buses 20 and 22, respectively, to block transfer buses 20 and 22 shown in FIG. 3. A SCSI-2 interface module 56 provides the necessary SCSI signals for the SCSI-2 protocol on data bus 36 and control bus 34.

Figures 5, 5A:
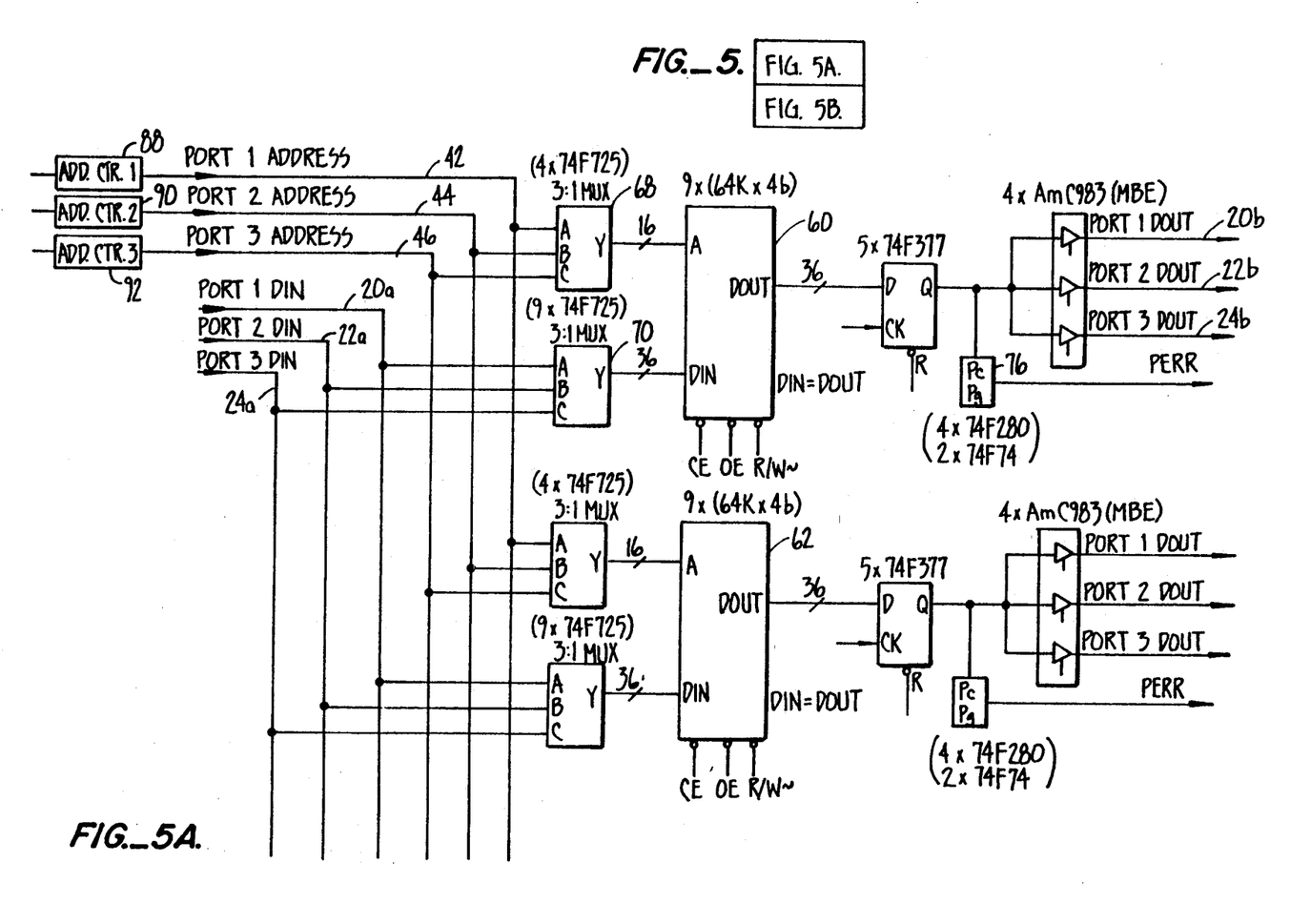
Figure 5B:
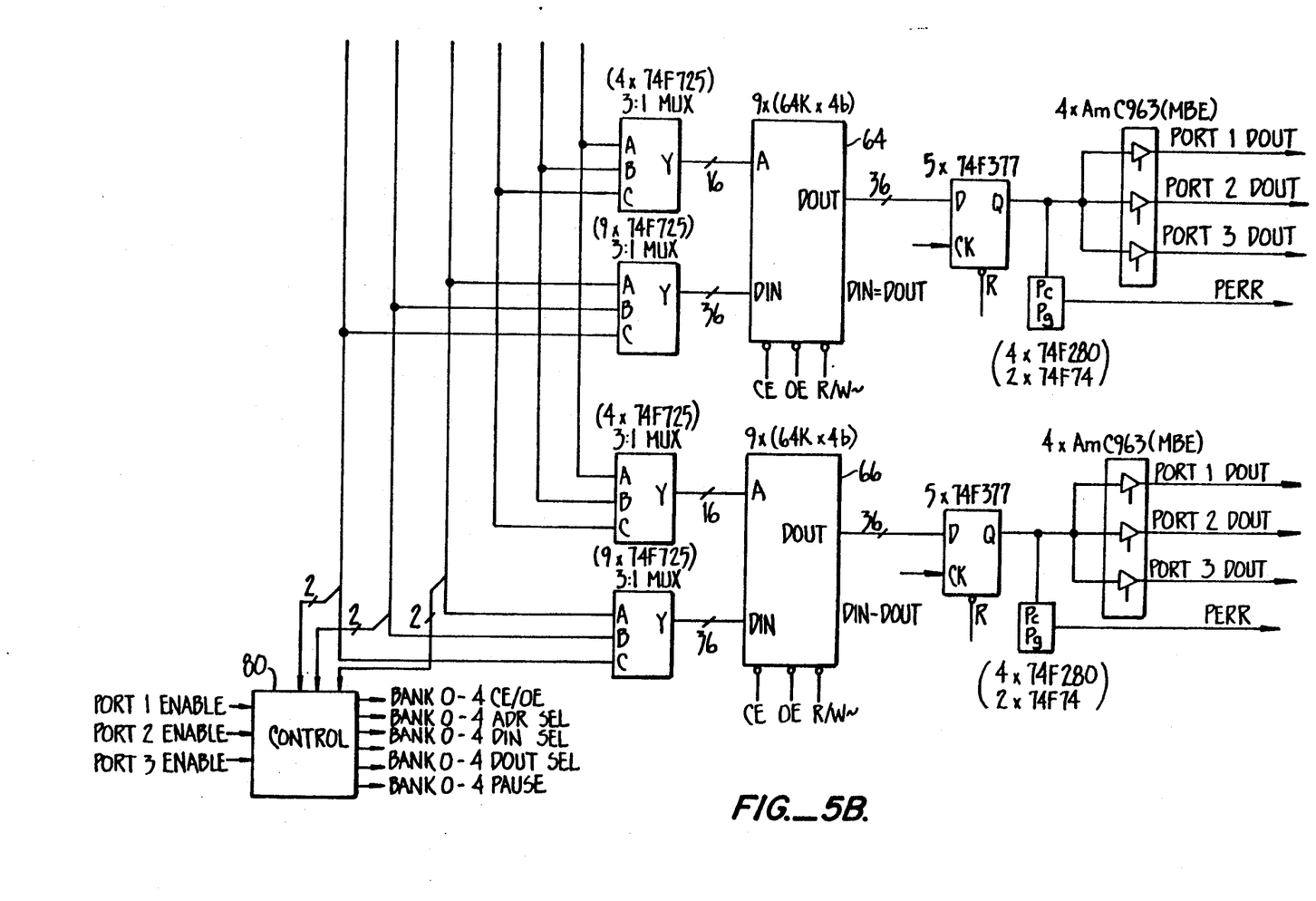

FIG. 5 shows the details of the buffer organization and control module 40 of FIG. 4. Four different memory banks 60, 62, 64 and 66 are shown.

For memory bank 60, a multiplexer 68 couples one of address ports 42, 44 and 46 of FIG. 4 to the address input (A) of memory bank 60. Similarly, a multiplexer 70 couples one of data ports 20, 22 and 24 to the data input (Din) of memory 60. The data output of memory 60 is provided through latch 72 to one of the three data ports 20, 22 and 24 through a transceiver 74. A parity-checking circuit 76 is coupled to the output of latch 72. The same circuitry is duplicated from memory banks 62, 64 and 66.

A read/write (R/W) and arbitration control circuit BD provides the control signals to the various memory banks. An enable signal is received from each port and is used for the arbitration. In addition, two bits of the address are provided from each port to control the rotation among the four banks as explained in the following discussion. Three address counters 88, 90 and 92 are coupled to the address inputs for ports 1, 2 and 3, respectively. These address counters can be loaded initially with a starting address and are then incremented once for each transfer cycle (i.e., binary value 0100 is loaded, and then incremented through 0101, 0110, 0111, etc.). Thus, only the starting address needs to be loaded, and thereafter the data words can simply be sequentially applied to the data input ports.

The selection of the particular two bits from the address which are provided to control circuit 80 determines the size of the block of data in each memory bank. When these bits are incremented as a result of an address change, it will switch from one bank to another.

Returning to FIG. 1B, one bus is devoted to accesses to/from disc and requires a throughput of 20 megabytes/second (although it accesses the memory at an instantaneous 40 megabytes/second), and two other buses are devoted to transfer to/from hosts and have bandwidths of 40 megabytes/second. Each bank of memory has a bandwidth of 40 megabytes/second, therefore capable of supporting access from only one of the buses. The aggregate memory bandwidth, however, is 160 megabytes/second (40×4 banks), much greater than the 100 megabytes/second required (40+40+20) to serve the 3 buses simultaneously.

Address space is divided within the memory subsystem such that a bus wishing to transfer a large amount of contiguous data switches often between the four memory banks. In one implementation, bank 0 holds the address space (represented in hexadecimal) 0—0×3f, while bank 1 holds the next sequential address space 0×40—0×7f, bank 2 holds the next sequential 0×80—0×bf, and bank 3 holds the next sequential 0×c0—0×ff, and the pattern repeats for the entire address space of the memory subsystem. The figure of 64 locations contiguous in one memory bank was chosen because the time to read or write 64 memory locations is much greater than the time to switch buses and access the first location of a static column DRAM, thus allowing the startup time to access the memory to be insignificant compared to the time for actually transferring the 64 memory elements. In addition, in a preferred embodiment the average amount of data needing to be transferred in one request is data for approximately 512 memory locations, meaning that all banks, on the average, will be accessed.

In another implementation, bank 0 holds the address 0, while bank 1 holds the address 0×1, bank 2 holds 0×2. and bank 3 holds 0×3, and the pattern repeats for the entire address space of the memory subsystem. This implementation might be used where the memory banks are made of static RAM, meaning that there is no latency associated with access to memory. Thus, the ports could be rotated among the banks for every word transferred without a start-up delay on the switch. This example leads to a system where there is minimum hold-off time before a bus is connected to a memory bank, since the new bus only need wait for one word to be transferred before a bank is freed-up.

A typical data request, therefore, would follow the following sequence:

1. The address, length, and control register are loaded. Crossbar logic sees 'Port Enable' signal.
2. Crossbar logic holds bus from being connected until no other bus is connected to the desired memory bank. This is typically a very short time: the maximum for an implementation with blocks of 64 locations in each memory bank is the amount of time for two other users to transfer 64 locations at 10 MHz, about 13 microseconds. By the same reasoning, an implementation with blocks of 1 location would have a maximum hold-off time of 200 nanoseconds.
3. The transfer starts. Once it starts, it is in lock step with the transfer that it waited for; when it reaches the end of the bank, so has the bus that is accessing the bank ahead of it. There should be no other pause in the data transfer, other than the normal delay for switching banks, because transfers that have already begun are given higher priority than 'new' transfers
4. Transfer finishes.

One important part of the crossbar logic decides who has priority to access a particular memory bank. The logic can be summarized as follows:
1. Each bus is assigned a permanent 'startup' priority. This priority is taken into account if multiple 'Port Enable' signals are asserted simultaneously and the address register for each transfer points to the same memory bank. In this example, the 20 megabyte/second transfer is given lowest priority. The first 40 megabyte/second bus is given highest priority.
2. A user that has started transferring and is switching banks to continue its transfer is given priority over a 'startup' transfer.

As will be understood by those familiar with the art, the present invention may be embodied in other specific forms without departing from the spirit or essential characteristics thereof. For example, the number of data banks and ports could be varied so long as there are at least as many data banks as there are data ports. Accordingly, the disclosure of the preferred embodiment of the invention is intended to be illustrative, but not limiting, of the scope of the invention which is set forth in the following claims.

We claim:
1. A memory buffering system comprising:
a plurality of buffer memories;
first and second data ports;
multiplexing means for selectively coupling each of said data ports to each of said buffer memories; and
sequencing means for providing control signals to said multiplexing means to alternately couple said data ports to each of said memories for the transfer of a first block of data into a first one of said buffer memories and concurrently transferring a second block of data out of a second one of said buffer memories, each of said memories having a capacity of a plurality of blocks of data.

2. The memory buffering system of claim 1 further comprising:
a plurality of address bus inputs, one associated with each of said data ports; and
multiplexing means for coupling each of said address bus inputs to one of said memories to which its corresponding data port is coupled.

3. The memory buffering system of claim 2 further comprising a separate address counter coupled to each of said address bus inputs.

4. The memory buffering system of claim 2 further comprising a number of bits of each said address bus sufficient to address said plurality of memories coupled as inputs to said sequencing means.

5. A method for accessing a memory buffering system having a plurality of memories and first and second data ports, comprising the steps of:
selectively coupling each of said data ports to each of said memories;
alternately coupling said data ports to each of said memories for the transfer of a block of data, each of said memories having a capacity of a plurality of blocks of data;
inputting data through the first port at the full bandwidth of the first port and simultaneously outputting data through the second port at the full bandwidth of the second port.

6. The method of claim 6 further comprising the step of coupling each of a plurality of address bus inputs, one associated with each of said data ports, to one of said memories to which its corresponding data port is coupled.

7. The memory buffering system of claim 1 wherein said sequencing means interleaves blocks of data from different ones of said ports in each of said memories.

8. The memory buffering system of claim 1 wherein said first port is coupled to a computer and said second port is coupled to a disk drive.

9. The memory buffering system of claim 1 further comprising a third data port, wherein said sequencing means provides control signals to couple said third data port to a different one of said buffer memories than said first and second data ports are coupled to.

* * * * *